United States Patent [19]
Doerre et al.

[11] Patent Number: 5,334,281
[45] Date of Patent: Aug. 2, 1994

[54] METHOD OF FORMING THIN SILICON MESAS HAVING UNIFORM THICKNESS

[75] Inventors: George W. Doerre, Poughkeepsie; Seiki Ogura, Hopewell Junction; Nivo Rovedo, La Grangeville, all of N.Y.

[73] Assignee: International Business Machines Corporation, Armonk, N.Y.

[21] Appl. No.: 876,598

[22] Filed: Apr. 30, 1992

[51] Int. Cl.$^5$ .......................................... H01L 21/08
[52] U.S. Cl. .......................... 156/636; 148/DIG. 50; 156/635; 156/645; 156/648; 156/649; 437/61; 437/78
[58] Field of Search ................. 148/DIG. 50; 437/61, 437/78; 156/635, 636, 645, 648, 649

[56] References Cited

U.S. PATENT DOCUMENTS

| | | | |
|---|---|---|---|
| 3,647,581 | 3/1972 | Mash | 148/175 |
| 3,929,528 | 12/1975 | Davidson et al. | 148/175 |
| 4,177,094 | 12/1979 | Kroon | 148/175 |
| 4,554,059 | 11/1985 | Short et al. | 204/129.3 |
| 4,735,679 | 4/1988 | Lasky | 156/636 |
| 4,897,362 | 1/1990 | Delgado et al. | 437/26 |
| 4,902,641 | 2/1990 | Koury | 437/62 |
| 4,970,175 | 11/1990 | Haisma et al. | 437/90 |
| 4,971,925 | 11/1990 | Alexander et al. | 437/62 |
| 4,983,538 | 1/1991 | Gotou | 437/100 |
| 5,032,544 | 7/1991 | Ito et al. | 437/228 |
| 5,034,343 | 7/1991 | Rouse et al. | 437/86 |
| 5,051,378 | 9/1991 | Yagi et al. | 437/225 |

OTHER PUBLICATIONS

B. Davari, et al., "A New Planarization Technique, Using a Combination of RIE and Chemical Mechanical Polish (CMP)", Technical Digest-1989 IEDM, pp. 61-64.

*Primary Examiner*—Asok Pal

[57] ABSTRACT

An SOI wafer has a device layer of initial thickness that is formed into a set of mesas in the interval between which a temporary layer of polysilicon is deposited to a precisely controlled thickness. This polysilicon is entirely converted in a self-limiting process to an oxide etch stop having a thickness much smaller than the initial thickness. The mesas are thinned by a chemical mechanical polishing technique until the mesa is the same level as the top surface of the new oxide. The etch stop layer of oxide is not removed but serves both as an isolating layer to provide dielectric isolation between mesas in the final circuit and also as a visual gauge to determine the time when the polishing process should stop.

10 Claims, 2 Drawing Sheets

METHOD OF FORMING THIN SILICON MESAS HAVING UNIFORM THICKNESS

TECHNICAL FIELD

The field of the invention is that of silicon on insulator (SOI) integrated circuits, in which transistors are formed in a thin device layer of single-crystal silicon that is positioned above an underlying insulating layer of silicon dioxide.

BACKGROUND OF THE INVENTION

In the field of SOI integrated circuits, a known problem has been that of fabricating a device layer that is sufficiently thin. Conventional methods of forming the underlying oxide insulating layer and the top device layer currently produce device layers that are about two microns thick. It is highly desirable to have thinner layers of one-tenth micron in thickness or less in order to produce fully depleted field effect transistors and to reduce device capacitance.

Various methods have been proposed in the art in order to reduce the thickness of a device layer that has previously been formed. U.S. Pat. No. 4,554,059 illustrates an electrochemical technique in which an etching process is used to thin the device layer from an initial thickness. U.S. Pat. No. 4,177,094 illustrates a method in which an underlying substrate is etched away entirely. None of these methods are satisfactory with regard to providing a thin layer of substantially uniform thickness.

U.S. Pat. No. 4,735,679 teaches the use of a polish stop layer and chemical-mechanical polishing to thin the silicon to the thickness of the polish stop layer. It discloses a refractory metal polish stop layer and a lift-off technique to remove the metal from the silicon surface to be polished.

SUMMARY OF THE INVENTION

The invention relates to an improved process for forming an SOI wafer in which a device layer of initial thickness is formed into a set of mesas in the interval between which a temporary gauge layer of polysilicon is deposited to a precisely controlled thickness. This polysilicon is entirely oxidized to form an oxide polish gauge. The separated silicon mesas are thinned by a chemical mechanical polishing technique until the mesa is coplanar with the top surface of the new oxide.

A feature of the invention is the use of a self-limiting process in which the oxidation of the temporary layer of polysilicon stops when it is all converted to oxide, thus maintaining the precision of the polish gauge thickness.

Another feature of the invention is the use of the oxide polish gauge layer both as an isolating layer to provide dielectric isolation between mesas and also as a visual gauge to determine the time when the polishing process should stop.

Yet another feature of the invention is the use of a nitride protective layer only in wide areas devoid of mesas in order to prevent excessive oxide or silicon removal that would reduce the planarity of the top surface.

BEST MODE OF CARRYING OUT THE INVENTION

Figure 1:
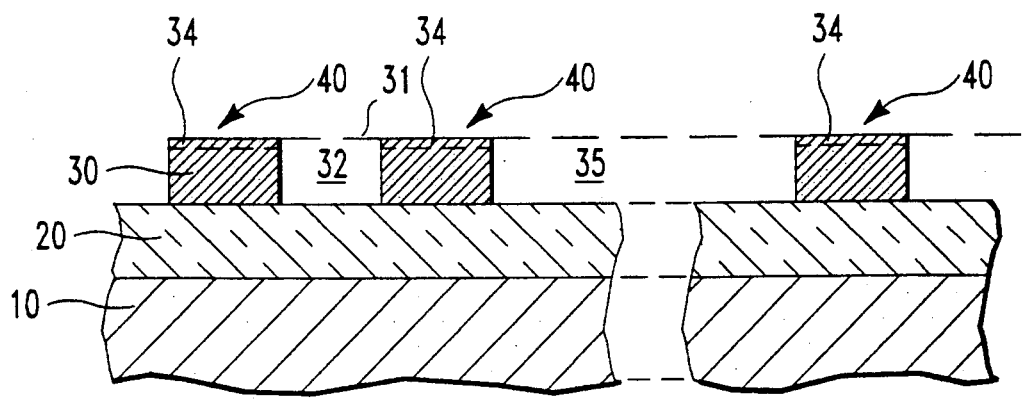
FIGS. 1–5 illustrate in cross-section portions of a wafer during an embodiment of the invention.

Referring now to FIG. 1, there is shown a cross-section of a portion of a wafer showing SOI oxide layer 20 and device layer 30 above bulk silicon substrate 10. The wafer at this stage, including oxide layer 20, has been formed by a conventional technique such as wafer bonding, in which two wafers, one or both of which have an initial oxide surface, are bonded together. Such SOI wafers are commercially available from a number of vendors, such as Shin Etsu Handotai.

Device layer 30 is the epitaxial monocrystalline device layer in which the transistors will be formed. It is shown in FIG. 1 as having been separated by a conventional reactive ion etching step into a set of silicon mesas, each denoted by the numeral 40, separated by a set of narrow trenches 32 surrounding the mesas and extending down to oxide layer 20, so that trenches 32 have a bottom surface of oxide. Illustratively, the reactive ion etch employs $HBr/Cl_2/He/O_2$. The initial surface of the device layer is indicated by the dotted line referenced with the numeral 31. For a nominal device layer thickness of 2 $\mu$m and a trench width of 1 $\mu$m, the aspect ratio of the mesa separation trenches is a reasonable 2:1, so that deposited materials will readily be able to fill the trenches uniformly.

Two widths of trench are illustrated in the drawing. A set of standard width mesa separation trenches 32 are conventionally set to be as small as the design rules will allow in order to provide the greatest device density on the integrated circuit. Trench 35 is used in areas where a number of interconnection lines are to be run or other areas that demand a wide empty space. One of the problems addressed by the invention is that of preventing the polishing operation from "dishing" a wide area such as 35 by removing too much of the material and lowering the top surface of the wafer below the position it has where the mesas are close together. For purposes of illustration, a wide area may be taken to be one having a width greater than 5 microns or more.

The problem addressed by the invention is that of reducing the thickness of mesas 40 in a precisely controlled manner and at the same time isolating them electrically. Prior art methods of reducing thickness relied on a number of methods, such as an etch for a predetermined time. As is well known in the art, timed etches are unreliable because of process variations. A related problem is that of maintaining the top surface of the final wafer substantially planar when a mechanical polishing technique is used. The approach taken in this invention is the use of a layer of precisely controlled thickness that performs two functions. The precisely controlled thickness permits its use as a thickness gauge for the mesas. It also serves as a dielectric isolation and is not removed after the polishing operation is complete.

Figure 2:
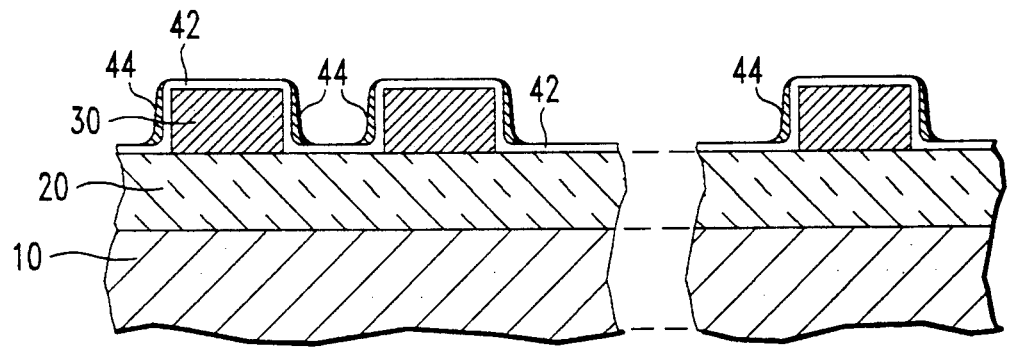

Referring now to FIG. 2, there is shown a cross-section of the same area after two additional layers have been deposited. A gauge layer 42 of polycrystalline silicon (polysilicon) has been deposited over the entire wafer, not only in the bottom parts of the trenches 32 but also on the top and sides of the mesas. This gauge layer has an illustrative gauge thickness of 600 Å. A second layer 44 of silicon nitride has been formed with a thickness of between 300 and 1,000 Å and then etched with a directional etch such as $CHF_3$ which is not only directional but also preferentially etches nitride over silicon. This type of etch is used to remove nitride on the horizontal surfaces, but to leave nitride sidewalls 44, which serve to protect polysilicon on the sides of the mesas during the next oxidation process.

Figure 3:
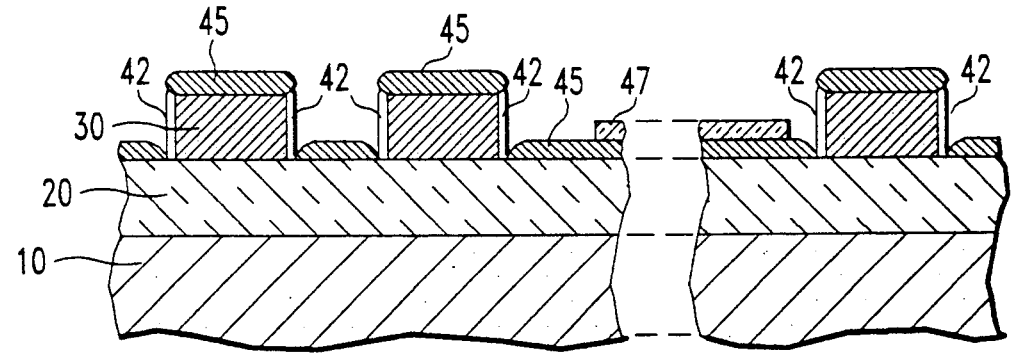

FIG. 3 shows the same area after an oxidation step of, for example, 45 minutes at 900° C. in steam has oxidized the entire thickness of polysilicon layer 42 where it is not protected by nitride 44, producing an oxide polish gauge layer 45 on the top of the mesas and in the trenches. Layer 45 has a polish gauge thickness that will be the final mesa thickness after the polishing step. It is an advantageous feature of the invention that the oxidation step is self-limiting. Since the insulating layer 20 is also oxide, the oxidation of poly layer 42 is not a critical step. A generous margin can be allowed in a timed oxidation step without running any risk of spoiling the precision of the thickness gauge.

Poly layer 42 is put down with a thickness of approximately 50% of the desired thickness of oxide layer 45 in order to allow for the increase in thickness during the oxidation process. In order to retain the self-limiting feature of the invention, it is necessary to use an SOI wafer whose buried oxide is substantially 100% $SiO_2$ with a sufficient thickness to prevent any further appreciable oxide growth after poly layer 42 is completely oxidized. An SOI wafer produced by the SIMOX method (implanted oxygen is reacted with the silicon) process would probably not be suitable because the insulating layers produced by such a process generally contain a substantial amount of residual unreacted silicon and would not halt further oxidation.

In FIG. 3 nitride sidewalls 44 have then been etched away with hot phosphoric acid and an optional polish stop layer of nitride 47 having thickness 1000 Å has been deposited in the wide trench 35 and removed in the vicinity of the mesas. An isotropic plasma etch with $CF_4+O_2$ is used to remove nitride layer 47 near the mesas by standard photolithographic means. This etch may or may not remove some or all of the polysilicon gauge layer 42. Should more precise (removal be desired, a thin oxide (150Å), shown as layer 34 in FIG. 1, may be grown on the mesas after they are patterned and prior to the deposition of poly layer 42. This will prevent etching of the mesas while allowing total removal of the polysilicon.

The result is illustrated in cross-section in FIG. 3, in which oxide layer 45 is exposed on the top of the mesas and on small horizontal portions near the mesas where layer 47 has been removed. Polysilicon layer 42 (if not etched off during the patterning of the nitride 47) is exposed on the mesa sidewalls and a protective nitride layer 47 is present on the wide area 35 in order to prevent dishing during the polishing operation.

A series of chemical mechanical polishing steps such as those illustrated in the *Technical Digest of the* 1989 *IEDM*, "A New Planarization Technique, Using a Combination of RIE and Chemical Mechanical Polish (CMP)", page 61 are used in order to remove both the exposed oxide and the silicon in mesas 40. This process continues until the mesa thickness is substantially the same as the polish gauge thickness of layer 45. The difference in height between the top mesa surface of mesa 40 and oxide 45 may be used as a discriminant in the polishing operation, with the mechanical polishing process being interrupted periodically to check the progress, as is known in the art.

The thickness of nitride polish stop layer 47, being about 1000 Å, is no hindrance to providing a substantially uniformly planar surface over the mesa because the offset between a mesa and the nearest nitride polish-stop layer can be, for example, 0.5 μm. The backing of the polishing pad is flexible enough to flex during the polishing operation to reach down from the level of nitride 47 to the level of oxide 45 over the distance created. Thus, even though polishing has stopped or slowed over nitride 47, silicon removal can still take place in the mesa region.

Figure 4:
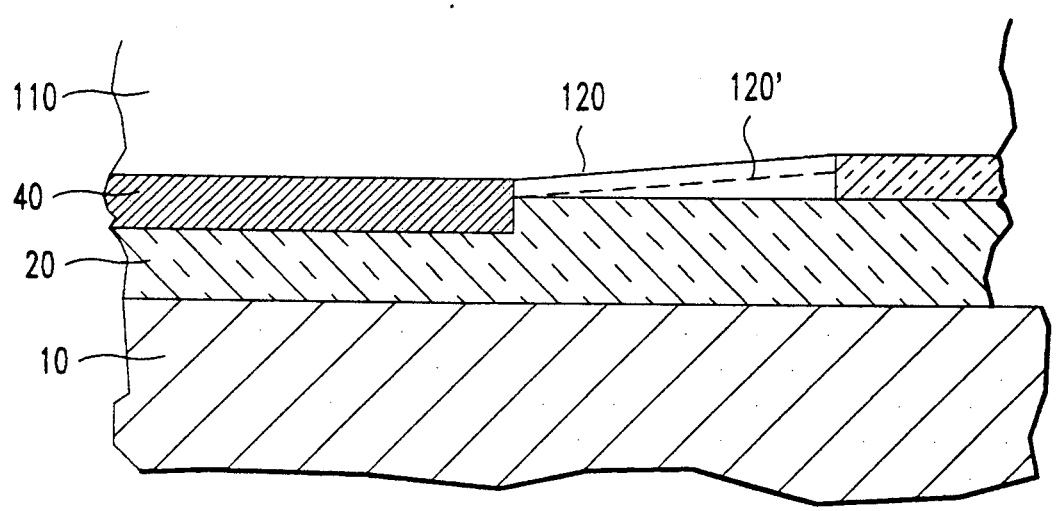

FIG. 4 shows in expanded form a portion of a wafer in the area between a protective nitride polish stop layer 47 and the nearest mesa 40, at a late stage in the operation. A polishing tool 110, available commercially, is in contact with both mesa 40 and protective nitride 47.

By use of a conventional slurry whose composition is known to those skilled in the technique, a rotating pad coming in contact with the wafer will remove oxide and silicon preferentially to oxide and affect nitride the least by a combination of chemical and mechanical action. As with any abrasive process, the highest topographic regions within a given area are removed first, providing planarization.

At this stage, enough material has been removed from mesa 40 that its mesa top surface is below the top surface of nitride 47. Previously, of course, the relative heights would have been the opposite. The lower surface of tool 110 is indicated by the line 120, showing that the surface flexes as it extends over oxide 45. At a later time, when the top of mesa 40 is substantially coplanar with oxide 45, the flexing is more pronounced, as indicated with the dotted line 120'. The polish stop layer is separated from the nearest mesa by a distance referred to as the polish height adjustment distance and the region from which the polish stop layer is removed is referred to as the polish height adjustment region. The polish height adjustment distance for a particular case will depend on the stiffness of the polish tool, and flexible tools will be able to flex and perform the height adjustment in a smaller horizontal distance than will a stiffer tool. The criterion for setting the polish height adjustment distance is that the polishing tool be able to flex enough to achieve the degree of coplanarity on the nearest mesa required for the particular application. Those skilled in the art will readily be able to determine the required degree of coplanarity and to test the operation of their polishing tools to set the polish height adjustment distance.

In operation, nitride 47 will be eroded at a much lower rate than the silicon and those skilled in the art will readily be able to adjust the initial thickness of nitride 47 so that a reasonable amount is left at the end of the polishing process to provide a margin of safety. It is not fatal if the entire layer of nitride 47 is removed, because some amount of dishing in such a wide area is tolerable. The minimum width for the use of a polish stop layer will be comparable to twice the polish height adjustment distance.

In the embodiment illustrated, the initial thickness of the silicon in mesas 40 was 2 μm and the initial thickness of nitride 47 was 0.1 μm. At the end of the polishing step, the mesa thickness was 0.1 μm and the remaining polish stop layer had a nominal thickness of 0.08 μm. It is preferable to remove the remainder of nitride 47 after the polishing step because the difference in the coefficient of thermal expansion between nitride 47 and oxide 20 may result in stress damage to the wafer during subsequent thermal processing that may affect device performance.

Similarly, the use of a nitride layer as the thickness gauge is less desirable than the poly-oxide combination, even though the oxidation step would be eliminated, because of potential performance impacts. When a layer is formed according to the invention, layers 45 and 20 form a single oxide layer with no interface.

Alternatively, it may be desired to directly deposit an oxide layer, rather than deposit and subsequently oxidize a poly layer, to form the gauge layer/intermesa isolation layer. However, the insulating qualities of deposited oxides are generally inferior to those of thermally grown oxides.

Figure 5:
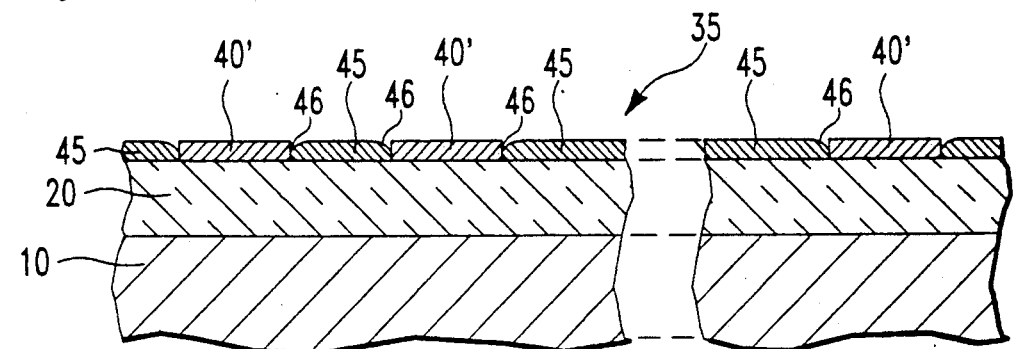

Referring now to FIG. 5, there is shown the final step in the process, in which mesas 40 are substantially co-planar with isolation oxide 45. Nitride layer 47 has been removed with a conventional phosphoric acid etch. A thin protective layer of oxide has been grown over mesas 40 to protect the device surface from contamination during the nitride removal step. Small depressions 46 are present at the edges of mesas 45 where nitride 44 extended down below the final height of oxide 45, but these have a typical depth of 500 Å for a mesa thickness of 0.1 $\mu$m and are not a substantial obstacle to quality device formation. There may be a potential leakage path along the edge of mesa 40 between the source and drain of a FET, and it may be necessary to take corrective measures such as implanting the mesa sidewalls, depending on the amount of leakage that can be tolerated in the intended application.

Figure 6:
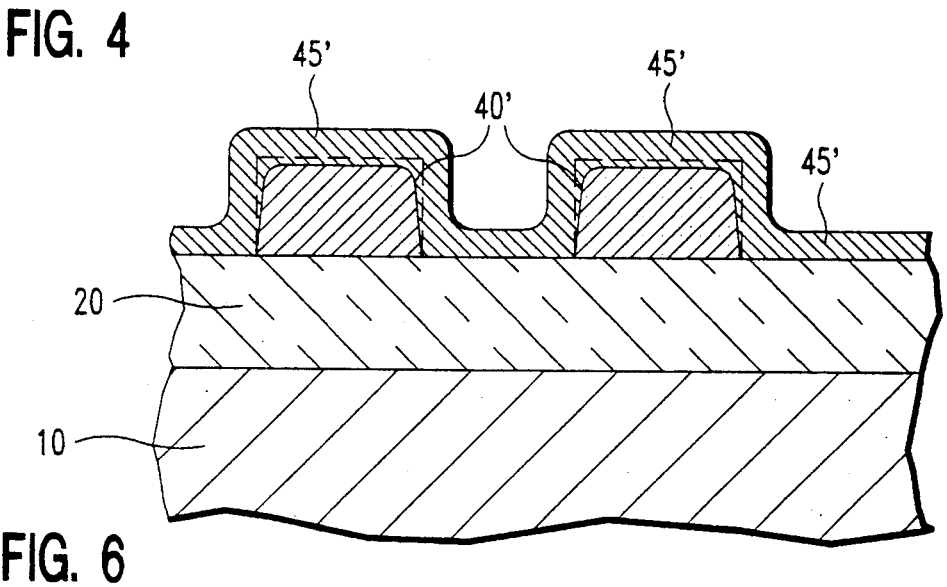
FIG. 6 illustrates a step in an alternative embodiment.

An alternative embodiment of the invention, in which the step of forming nitride sidewalls 44 has been omitted, is illustrated in FIG. 6, showing the result of oxidizing mesas 40. The initial surface of mesa 40 is shown by the dashed line labelled 40'. Without sidewalls 44, oxide 45' has formed on the sides of mesa 40 as well as on the top. Oxide has penetrated horizontally through surface 40' because of tolerance in the timed oxidation process. The final horizontal dimension of the mesas 40 will therefore be smaller and possibly more variable than in the preferred embodiment and it may be necessary to provide for a greater tolerance in fitting transistors into the mesas to provide the desired final transistor dimensions. Whether the omission of the nitride step will compensate for the less regular mesa dimension will depend on the usual engineering tradeoffs, well known to those skilled in the art.

Figure 7:
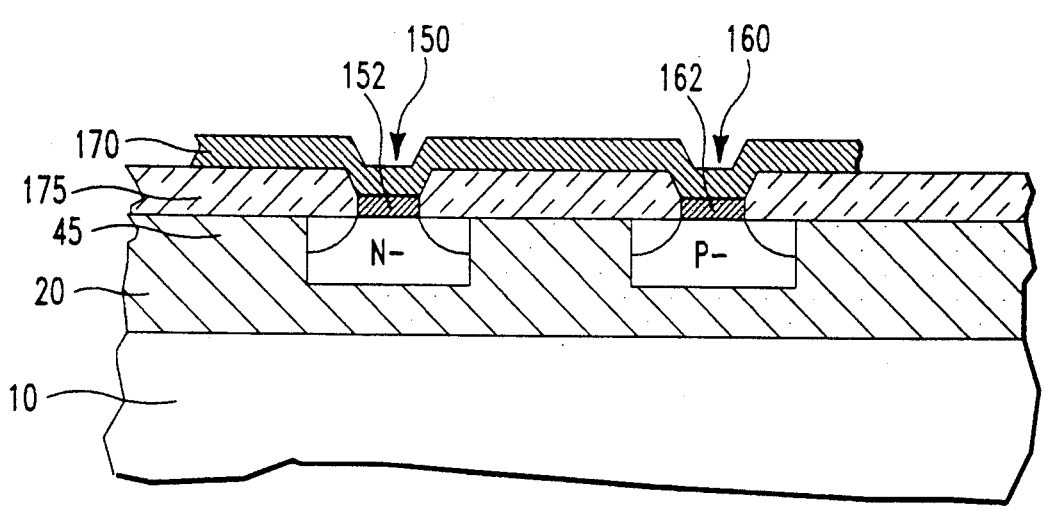
FIG. 7 shows a portion of a circuit.

FIG. 7 shows a portion of a circuit according to the invention, in which two FETs 150 and 160, having polysilicon gates 152 and 162 are connected by metal interconnection 170 to form an inverter. FETs 150 and 160 are enclosed and electrically isolated by a composite oxide formed from layers 20 and 45, showing the advantage of using the polish stop level as part of the mesa isolation layer. A layer of deposited oxide 175 serves as the interlevel or interlayer dielectric to separate the first level of interconnection (conventionally polysilicon) from an upper level (conventionally aluminum metal).

Those skilled in the art will readily be able, in the light of this disclosure, to devise alternative embodiments of the invention and the following claims are not meant to be restricted to the embodiments disclosed.

We claim:

1. A method of forming isolated silicon mesas from a wafer having a bulk silicon substrate, an insulating oxide layer disposed above said substrate and a silicon device layer above said oxide layer, comprising the steps of:
    forming a set of trenches in said device layer, said trenches being disposed to define a plurality of silicon mesas and extending from a first device layer surface down to said oxide layer, whereby said trenches have a bottom surface of oxide;
    depositing a gauge layer of polycrystalline silicon having a predetermined gauge thickness in said set of trenches; oxidizing said gauge layer of polysilicon to form an oxide polish gauge layer of predetermined polish gauge thickness, related to said predetermined gauge thickness, in said trenches, whereby said mesas are surrounded by said oxide polish gauge layer having an oxide gauge surface said predetermined polish gauge thickness above said first layer surface; and
    polishing said mesas by chemical-mechanical polishing until said mesas are substantially co-planar with said oxide gauge surface, whereby said oxide polish gauge layer acts as a thickness gauge to establish a mesa thickness of said mesas.

2. A method according to claim 1, further comprising the steps of:
    depositing a first nitride layer of silicon nitride on said plurality of silicon mesas and etching said first nitride layer with a directional selective etch to remove said first nitride layer, leaving only a plurality of nitride sidewalls on said plurality of silicon mesas, whereby a portion of said gauge layer located on sidewalls of said plurality of silicon mesas is protected from oxidation during said step of oxidizing said gauge layer; and
    removing said nitride sidewalls after said step of oxidizing said gauge layer.

3. A method according to claim 1, further comprising the steps of:
    depositing a polish stop layer of nitride after said step of oxidizing said gauge layer to form said oxide polish gauge layer; and
    removing said polish stop layer from said plurality of silicon mesas and from a polish height adjustment region extending a predetermined polish height adjustment distance from a nearest one of said plurality of mesas, whereby said polish stop layer prevents removal of material from said oxide polish gauge layer in
    locations separated from a nearest mesa by said polish height adjustment distance.

4. A method according to claim 3, further comprising the steps of:
    forming a thin layer of oxide on said mesas before said step of depositing said gauge layer of polycrystalline silicon, whereby said mesas are protected by said thin layer of oxide during said step of removing said polish stop layer from said plurality of silicon mesas.

5. A method according to claim 2, further comprising the steps of:
    depositing a polish stop layer of nitride after said step of removing said nitride sidewalls; and
    removing said polish stop layer from said plurality of silicon mesas and from a polish height adjustment region extending a predetermined polish height adjustment distance from a nearest one of said plurality of mesas.

6. A method according to claim 5, further comprising the steps of:

forming a thin layer of oxide on said mesas before said step of depositing said gauge layer of polycrystalline silicon, whereby said mesas are protected by said thin layer of oxide during said step of removing said polish stop layer from said plurality of silicon mesas.

7. A method of forming an integrated circuit having devices formed in isolated silicon mesas in a device layer from a wafer having a bulk silicon substrate, an insulating oxide layer disposed above said substrate and a silicon device layer above said oxide layer, comprising the steps of:

forming a set of trenches in said device layer, said trenches being disposed to define a plurality of silicon mesas and extending from a first device layer surface down to said oxide layer, whereby said trenches have a bottom surface of oxide;

depositing a gauge layer of polycrystalline silicon having a predetermined gauge thickness in said set of trenches;

oxidizing said gauge layer of polysilicon to form an oxide polish gauge layer of predetermined polish gauge thickness, related to said predetermined gauge thickness, in said trenches, whereby said mesas are surrounded and electrically isolated by said oxide polish gauge layer having an oxide gauge surface said predetermined polish gauge thickness above said first layer surface;

polishing said mesas by chemical-mechanical polishing until said mesas are substantially co-planar with said oxide gauge surface, whereby said oxide polish gauge layer acts as a thickness gauge to establish a mesa thickness of said mesas;

forming a plurality of electrical devices in said plurality of silicon mesas;

forming at least one interlayer dielectric above said oxide polish gauge layer; and forming a set of device interconnections extending above said polish gauge layer to connect said plurality of electrical devices in an integrated circuit.

8. A method according to claim 7, further comprising the steps of:

depositing a first nitride layer of silicon nitride on said plurality of silicon mesas and etching said first nitride layer with a directional selective etch to remove said first nitride layer, leaving only a plurality of nitride sidewalls on said plurality of silicon mesas, whereby a portion of said gauge layer located on sidewalls of said plurality of silicon mesas is protected from oxidation during said step of oxidizing said gauge layer; and removing said nitride sidewalls after said step of oxidizing said gauge layer.

9. A method according to claim 7, further comprising the steps of:

depositing a polish stop layer of nitride after said step of oxidizing said gauge layer to form said oxide polish gauge layer; and removing said polish stop layer from said plurality of silicon mesas and from a polish height adjustment region extending a predetermined polish height adjustment distance from a nearest one of said plurality of mesas, whereby said polish stop layer prevents removal of material from said oxide polish gauge layer in locations separated from a nearest mesa by said polish height adjustment distance.

10. A method according to claim 9, further comprising the steps of:

forming a thin layer of oxide on said mesas before said step of depositing said gauge layer of polycrystalline silicon, whereby said mesas are protected by said thin layer of oxide during said step of removing said polish stop layer from said plurality of silicon mesas.

* * * * *